(12) United States Patent
Chen et al.

(10) Patent No.: US 7,450,379 B2
(45) Date of Patent: Nov. 11, 2008

(54) HEAT DISSIPATION DEVICE AND FAN MODULE THEREOF

(75) Inventors: Ying-Chi Chen, Taoyuan Hsien (TW); Ja-Jeng Lu, Taoyuan Hsien (TW); Te-Tsai Chuang, Taoyuan Hsien (TW); Ming-Shi Tsai, Taoyuan Hsien (TW); Wen-Shi Huang, Taoyuan Hsien (TW)

(73) Assignee: Delta Electronics, Inc., Taoyuan Sien (TW)

( * ) Notice: Subject to any disclaimer, the term of this patent is extended or adjusted under 35 U.S.C. 154(b) by 388 days.

(21) Appl. No.: 11/029,498

(22) Filed: Jan. 6, 2005

(65) Prior Publication Data

US 2005/0174734 A1    Aug. 11, 2005

(30) Foreign Application Priority Data

Feb. 5, 2004    (TW)  ............................... 93102594 A

(51) Int. Cl.
*H05K 7/20* (2006.01)
*G06F 1/16* (2006.01)

(52) U.S. Cl. .................. 361/695; 361/690; 361/694; 415/213.1; 312/236; 454/186

(58) Field of Classification Search ................ 361/695, 361/690, 694; 312/236; 454/186; 415/213.1
See application file for complete search history.

(56) References Cited

U.S. PATENT DOCUMENTS

| | | | | |
|---|---|---|---|---|
| 4,575,038 A | * | 3/1986 | Moore | 248/505 |
| 4,972,294 A | * | 11/1990 | Moses et al. | 361/704 |
| 5,138,524 A | * | 8/1992 | Smithers | 361/704 |
| 5,208,730 A | * | 5/1993 | Tracy | 361/687 |
| 5,788,566 A | * | 8/1998 | McAnally et al. | 454/184 |
| 6,031,719 A | * | 2/2000 | Schmitt et al. | 361/695 |
| 6,040,981 A | * | 3/2000 | Schmitt et al. | 361/695 |
| 6,236,564 B1 | * | 5/2001 | Fan | 361/695 |
| 6,556,437 B1 | | 4/2003 | Hardin | |
| 6,633,486 B2 | * | 10/2003 | Coles et al. | 361/726 |
| 6,639,796 B2 | * | 10/2003 | Cannon | 361/695 |
| 6,665,908 B1 | * | 12/2003 | Mease | 16/422 |
| 6,674,641 B2 | * | 1/2004 | Jensen et al. | 361/687 |
| 6,731,502 B1 | * | 5/2004 | Hsu | 361/695 |
| 6,839,233 B2 | * | 1/2005 | Cravens et al. | 361/695 |
| 6,865,078 B1 | * | 3/2005 | Chang | 361/695 |
| 6,961,248 B2 | * | 11/2005 | Vincent et al. | 361/796 |
| 6,970,353 B2 | * | 11/2005 | Brovald et al. | 361/687 |
| 2003/0011985 A1 | * | 1/2003 | Jensen et al. | 361/687 |
| 2004/0130872 A1 | * | 7/2004 | Cravens et al. | 361/695 |
| 2005/0024832 A1 | * | 2/2005 | Lee et al. | 361/704 |

* cited by examiner

*Primary Examiner*—Anatoly Vortman
(74) *Attorney, Agent, or Firm*—Birch, Stewart, Kolasch & Birch, LLP

(57) ABSTRACT

A heat dissipation device and fan module. The fan module is fixed to a fan tray, which has a track with a first engaging portion. A securing member is disposed on a shield, comprising a second engaging portion. The second engaging portion enters the first engaging portion, fixing the fan module to the fan tray. An actuator connects the securing member and the shield. When external force deforms the actuator, the securing member deforms therewith, withdrawing the second engaging portion from the first engaging portion.

8 Claims, 3 Drawing Sheets

HEAT DISSIPATION DEVICE AND FAN MODULE THEREOF

BACKGROUND OF THE INVENTION

1. Field of the Invention

The present invention relates to a fan module and, more particularly, to a fan module that can be easily assembled and disassembled from a fan tray.

2. Brief Discussion of the Related Art

A conventional fan module is fixed to a housing or fan tray of a computer by screws or rivets. To prevent contact with the fan, fan guards are disposed at both airflow entry and exit. However, this increases fabrication complexity and complicates disassembly.

U.S. Pat. No. 5,788,566 discloses a fan module in which a plurality of threaded engaging portions connect the frame, fan module, and fan guard to an electronic device without requiring tools. The engaging portions are easily damaged, however, and connection is time-consuming.

U.S. Pat. No. 6,556,437B1 discloses another fan module in which two half shields connect to form a complete shield, with a handle inserted into cantilevers on two sides of the completed shield. When the handle is raised, the cantilevers rise therewith, enabling fan module removal without tools.

However, the fan module comprising two half shields is difficult to disassemble. The cantilevers, of plastic, are easily cracked, and the handle is easily damaged or separated from the cantilever after prolonged use. The plurality of fan modules cannot vertically overlap, reducing available space in the electronic device.

SUMMARY OF THE INVENTION

Accordingly, a fan module is disclosed, fixed to a first engaging portion on a track of a fan tray. The fan module comprises a shield, a securing member, and an actuator. The securing member is disposed on the shield, having a second engaging portion. The second engaging portion connects to the first engaging portion such that the fan module is fixed to the fan tray. The actuator connects the securing member and the shield. When external force parallel to the actuator deforms the actuator, the securing member deforms therewith, and the first engaging portion separates from the second engaging portion.

Embodiments of the present invention further provide a heat dissipation device comprising a housing and a fan module. The housing comprises a first engaging portion. The fan module comprises a shield, a securing member, and an actuator. The securing member is disposed on the shield, having a second engaging portion. The second engaging portion connects to the first engaging portion such that the fan module is fixed on the housing. The actuator connects the securing member and the shield. When external force parallel to the actuator deforms the actuator, the securing member deforms therewith, and the first engaging portion separates from the second engaging portion.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be become more fully understood from the subsequent detailed description and the accompanying drawings, which are given by way of illustration only, and thus are not limitative of the present invention, and wherein.

DETAILED DESCRIPTION OF THE PREFERRED EMBODIMENTS

Figure 1:
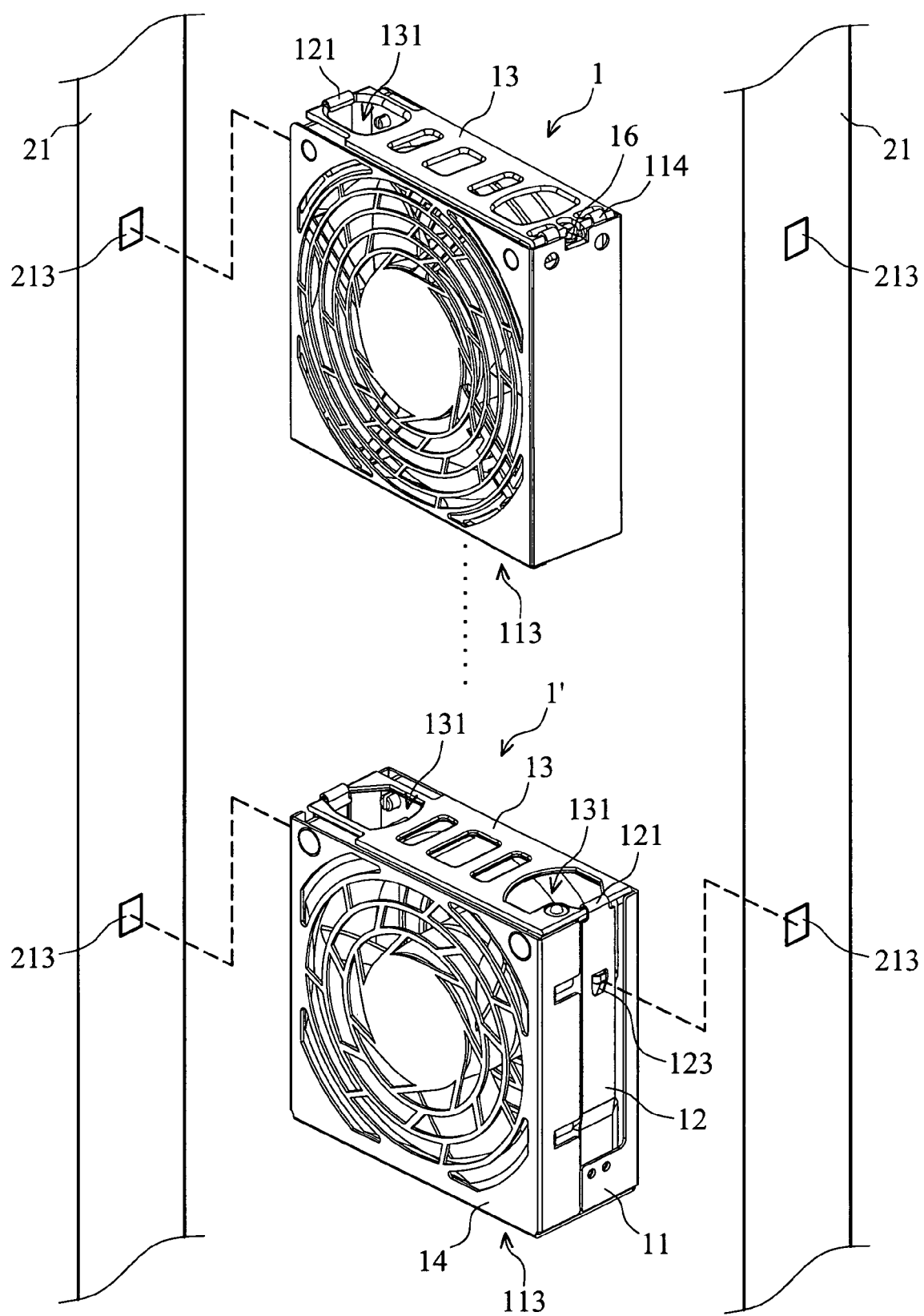
FIG. 1 is a schematic diagram of fan modules of embodiments of the present invention connected to a track in a fan tray.

FIG. 1 shows fan modules 1 and 1' installed on a fan tray (not shown). Fans in the modules rotate and dissipate heat from an electronic device.

Tracks 21 are disposed in the fan tray, and first engaging portions 213 are formed thereon. The first engaging portions 213 can also be directly formed on a shield of an electronic device or a track in an electronic device.

As shown in FIG. 1, the fan module 1 comprises a shield 11, a securing member 12, an actuator 13, and a fan guard 14. The shield 11 is integrally formed of metal with a U-shaped cross section. The securing member 12 is disposed on one side of the shield 11, and the actuator 13 is disposed in the notch of the U-shaped shield 11 on a rear side 113. The fan guards 14 are disposed at both the airflow entry and exit of the shield 11 to prevent contact with fans, with a plurality of ribs 141.

Furthermore, the fan module 1' comprises a shield 11, a securing member 12, an actuator 13, and a fan guard 14. The shield 11 is integrally formed of metal with a U-shaped cross section. The securing members 12 are disposed on both sides of the shield 11 respectively, and the actuator 13 is disposed in the notch of the U-shaped shield 11 on rear side 113. The fan guards 14 are formed on both the airflow entry and exit of the shield 11 to prevent contact with fans, with a plurality of ribs 141.

In the following embodiments of the invention, the securing member 12 provides a second engaging portion 123 connected to the first engaging portion 213 to fix the fan module 1 and 1' to the track 21 of the fan tray. The track 21 provides several first engaging portions 213, such that many fan modules 1 and/or 1' can be vertically arranged, providing maximum heat dissipation capability.

The first engaging portion 213 corresponds to the second engaging portion 123. As shown in FIG. 1, the first engaging portion 213 is an opening receiving the second engaging portion 123, a stud. Further, the first engaging portion 213 can be a recess, and the second engaging portion 123 can be a protrusion connected thereto. The first engaging portion 213 and the second engaging portion 123 can vary with demand.

First Embodiment

Figure 2A:
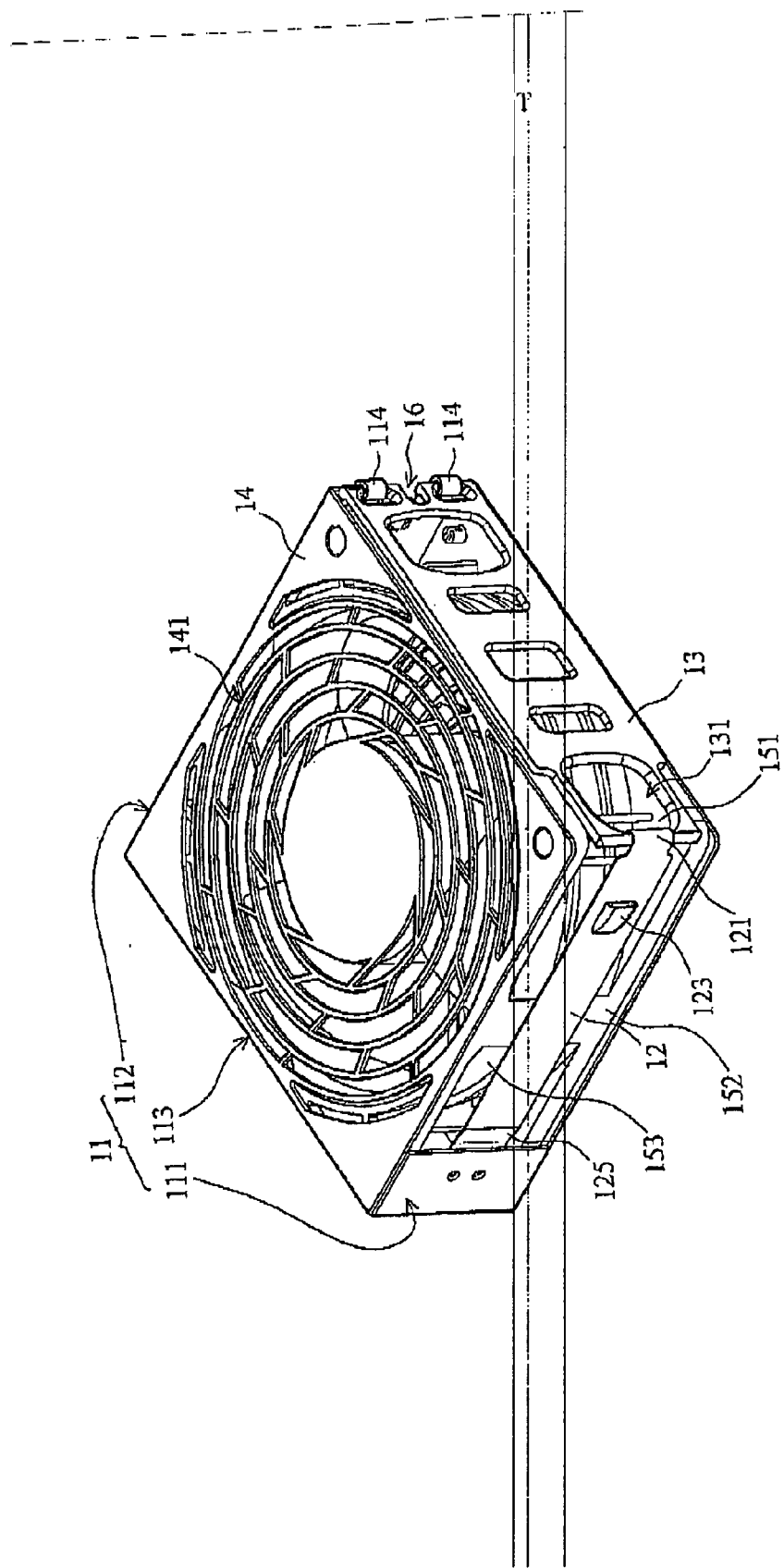
FIG. 2A is a schematic diagram of a fan module of a first embodiment of the present invention.

FIG. 2A shows a first embodiment of the present invention. A fan module 1 of this embodiment comprises a shield 11 with a first side 111, second side 112, and a rear side 113. The securing member 12 is disposed on either side 112 or 111. In this embodiment, the securing member 12 is disposed on the first side 111. The actuator 13 is a flexible member 13. One end of the flexible member 13 connects to the securing member 12, and the other end connects to the shield 11. For example, the second side 112 of the shield 11 can provide a hook 114 to connect the flexible member 13. The fan module 1 further comprises a fan 153 having a frame 152 with an accommodating recess 151 on a corner thereof.

Further, a ramp 125 is provided on one end of the securing member 12 near the shield 11, enhancing the elasticity of the securing member 12. The other end of the securing member 12 provides a curved portion 121. An opening 131 on the actuator 13 allows connection of the curved portion 121 thereto.

For attachment, the fan module 1 is held by the opening 131 and slid along the track 21 of a fan tray until the second engaging portion 123 enters the first engaging portion 213. Several fan modules 1 can be attached sequentially to the fan tray as required for maximum dissipation effect.

When the fan module 1 is removed from the fan tray, force exerted in the opening 131 away from the track 21 deforms the securing member 12 and the flexible member 13 accordingly, such that the first engaging portion 213 is withdrawn from the second engaging portion 123. Upward force applied upward separates the fan module 1 from the track 21. As mentioned above, only one opening 131 is required only one and near the securing member 12.

Second Embodiment

Figure 2B:
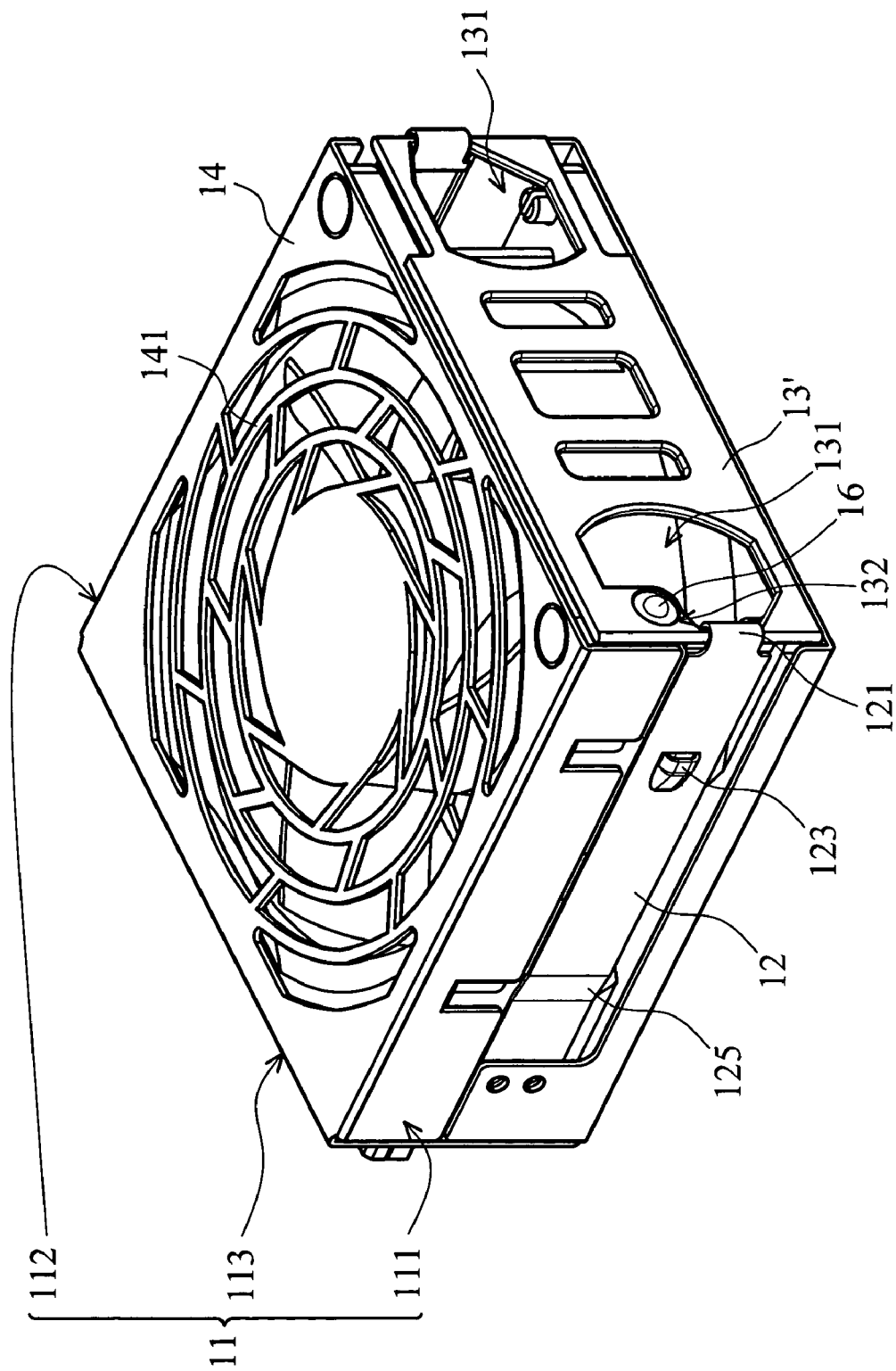
FIG. 2B is a schematic diagram of another fan module of a second embodiment of the present invention.

FIG. 2B shows a second embodiment of the present invention. A fan module 1' of this embodiment comprises a shield 11 with a first side 111, a second side 112, and a rear side 113. In this embodiment, the securing member 12 is disposed on first side 111 and second side 112. The actuator 13' which may be a flexible member 13' connects two securing members 12.

Similarity, a ramp 125 is provided on one end of the securing member 12 near the shield 11, enhancing the elasticity of the securing member 12. The other end of the securing member 12 provides a curved portion 121. Openings 131 are formed on the actuator 13' such that two curved portions 121 of securing members 12 respectively connect thereto.

For attachment, the fan module 1' is held by the openings 131 and slid along the track 21 of a fan tray until the second engaging portions 123 enter the first engaging portions 213. Several fan modules 1' can be attached sequentially to the fan tray as required for maximum dissipation effect.

When the fan module 1' is removed from the fan tray, force exerted in openings 131 away from the track 21 deforms the securing members 12 and the flexible member 13' accordingly, such that the first engaging portions 213 are withdrawn from the second engaging portion 123. Upward force applied upward separates the fan module 1' from the track 21.

Further, the flexible member 13 and 13' provide an aperture 132 with a light 16. The light 16 electronically connects to the fan in the module 1 or 1', indicating the operating condition of the fan.

The actuator (flexible member) may be plastic, and the securing member may be stainless steel.

Embodiments of the present invention may provide simplified assembly, the securing member and the actuator that are not easily broken, reduced volume, fewer components, and reduced assembly steps.

While the invention has been described by way of example and in terms of preferred embodiments, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fan module adapted to be used with a system frame having a first engaging portion, the fan module comprising:
a fan having a frame with an accommodating recess on a corner thereof;
a shield disposed outside the fan;
a securing member disposed on the shield and having a second engaging portion, wherein the second engaging portion engages with the first engaging portion such that the fan module is fixed to the system frame; and
a flat actuator connecting the securing member and the shield, and having an opening positioned corresponding to the accommodating recess for allowing an external force to deform the actuator, so as to withdraw the second engaging portion from the first engaging portion.

2. The fan module as claimed in claim 1, wherein the securing member has a curved portion in the opening, which connects the securing member and the actuator.

3. The fan module as claimed in claim 1, wherein the actuator is a flexible member.

4. The fan module as claimed in claim 1, wherein the first engaging portion has an opening and the second engaging portion has a stud entering the opening, or wherein the first engaging portion has a recess and the second engaging portion has a protrusion entering the recess.

5. The fan module as claimed in claim 1, wherein the actuator has an aperture, a light is disposed in the aperture, and the light indicates an operating condition of the fan.

6. The fan module as claimed in claim 1, further comprising a fan guard formed on the top and lower surfaces of the shield, the fan guard having a plurality of ribs.

7. The fan module as claimed in claim 1, wherein the actuator is plastic, the securing member is stainless steel, and the shield is U-shaped.

8. The fan module as claimed in claim 1, wherein the shield has a hook which connects to the actuator.

* * * * *